US005354419A

United States Patent [19]

Hadimioglu

[11] Patent Number: 5,354,419

[45] Date of Patent: Oct. 11, 1994

[54] ANISOTROPICALLY ETCHED LIQUID LEVEL CONTROL STRUCTURE

[75] Inventor: Babur B. Hadimioglu, Mountain View, Calif.

[73] Assignee: Xerox Corporation, Stamford, Conn.

[21] Appl. No.: 927,103

[22] Filed: Aug. 7, 1992

[51] Int. Cl.[5] .................... H01L 21/306; B44C 1/22

[52] U.S. Cl. .................... 156/644; 156/647; 156/661.1; 156/662; 156/633

[58] Field of Search .............. 156/644, 647, 653, 654, 156/657, 659.1, 661.1, 662, 633; 346/1.1, 140 R

[56] References Cited

U.S. PATENT DOCUMENTS

| | | | |
|---|---|---|---|
| 4,106,976 | 8/1978 | Chiou et al. | 156/647 |
| 4,308,547 | 12/1981 | Lovelady et al. | 346/140 |
| 4,751,530 | 6/1988 | Elrod et al. | 346/140 |
| 4,751,534 | 6/1988 | Elrod et al. | 346/140 |
| 5,028,937 | 7/1991 | Khuri-Yakub et al. | 346/140 |
| 5,041,849 | 8/1991 | Quate et al. | 346/140 |
| 5,277,754 | 1/1994 | Hadimioglu et al. | 156/644 |

OTHER PUBLICATIONS

Chiou et al., Ink Jet Nozzles, IBM Technical Disclosure Bulletin, vol. 19, No. 9, Feb. 1977, p. 3569.

*Primary Examiner*—William A. Powell
*Attorney, Agent, or Firm*—John M. Kelly

[57] ABSTRACT

A liquid level control structure and a method for its production. The liquid level control structure is comprised of a wafer having substantially flat top and bottom surfaces and a channel for containing a marking fluid. The channel is defined by inwardly sloping walls that extend through the wafer and that join with the top surface of the wafer to define protrusions. The protrusions interact with the marking fluid's surface tension so as to control the location of an unbounded surface of the fluid within the channel.

An alternative embodiment liquid level control structure uses a thin film layer deposited over the wafer's top surface that extends over the protrusions to form lips. Those lips interact with the marking fluids surface tension to control the location of the unbounded surface.

The methods for producing the liquid level control structures use semiconductor fabrication techniques such as photolithography and anisotropic etching.

3 Claims, 5 Drawing Sheets

ANISOTROPICALLY ETCHED LIQUID LEVEL CONTROL STRUCTURE

BACKGROUND OF THE PRESENT INVENTION

Because acoustic ink printers (ALP) avoid the clogging and manufacturing problems of the more conventional drop-on-demand, nozzle-based ink jet printers, they represent a promising direct marking technology. While significant effort has gone into developing acoustic ink printing, see, for example, U.S. Pat. Nos. 4,751,530; 4,751,534; 5,028,937; and 5,041,849, various problems remain to be solved before AIP becomes a viable marking technology.

An acoustic ink printer utilizes acoustic energy to eject droplets from an unbounded surface of a marking fluid onto a recording surface. Typically this involves focusing acoustic energy from an ultrasonic transducer, using either a spherical or a fresnel (reference U.S. Pat. No. 5,041,849) acoustic lens, into a focal area near the unbounded surface. If the acoustic energy is sufficient, an ink droplet having a diameter about the same as the acoustic wavelength is ejected. For a more detailed description of the ejection process reference is made to U.S. Pat. Nos. 4,308,547 and 5,028,937, and the citations therein.

As may be appreciated, acoustic ink printers are sensitive to the spacing between the acoustic energy's focal area and the unbounded surface. Since the acoustic focal plane is generally fixed, it is important that the unbounded surface be properly and accurately positioned. Indeed, since current practice dictates that the acoustic focal area be within about one wavelength of the unbounded surface, typically about 10 micrometers, the position must be very accurately controlled. While various liquid level control structures and techniques have been tried, see, for example, U.S. Pat. No. 5,028,937 (which discusses positioning the unbounded surface with a perforated membrane), and U.S. patent application Ser. No. 07/810,248, filed Dec. 19, 1991 (which discloses an anisotropically etched liquid level control structure having inwardly protruding knife-edged lips), all have their problems.

It would be beneficial to have a liquid level control structure that accurately controls the location of the unbounded surface of a liquid, that is producible at low cost, that allows droplets to be ejected onto a recording medium, and that readily attaches to the other sections of the print head.

SUMMARY OF THE INVENTION

In accordance with the present invention there is provided a liquid level control structure comprised of a substrate having a slot shaped channel for holding a marking fluid, beneficially an ink. The channel has inwardly sloping walls which form a narrower top orifice and a broader bottom orifice, with the top orifice and sloping walls defining wedge shaped protrusions. The protrusions provide a framework for controlling the location of the marking fluid's unbounded surface via the fluid's surface tension.

The liquid level control structure is beneficially produced from a silicon <100> wafer using semiconductor fabrication techniques. An etch stop layer, beneficially of silicone nitride, is deposited over the top and bottom wafer surfaces. A photoresist layer is then deposited over the etch stop layer. Where the bottom orifice is to be located, a slot is photolithographically defined through the photoresist layer to expose part of the etch stop layer. The exposed etch stop layer is then removed, to expose a section of the wafer, by use of a suitable etchant. The remaining photoresist is then dissolved. The exposed section is then anisotropically etched (using an etchant such as KOH) through the wafer to the top etch stop layer, whereby the protrusions are formed. The completed liquid level control structure may then be prepared for bonding onto a host substrate, beneficially using a bonding technique that has a controlled bond thickness, such as anodic or thin-epoxy bonding.

BRIEF DESCRIPTION OF THE DRAWINGS

Other aspects of the present invention will become apparent as the following description proceeds and upon reference to the drawings, in which.

Figure 1:
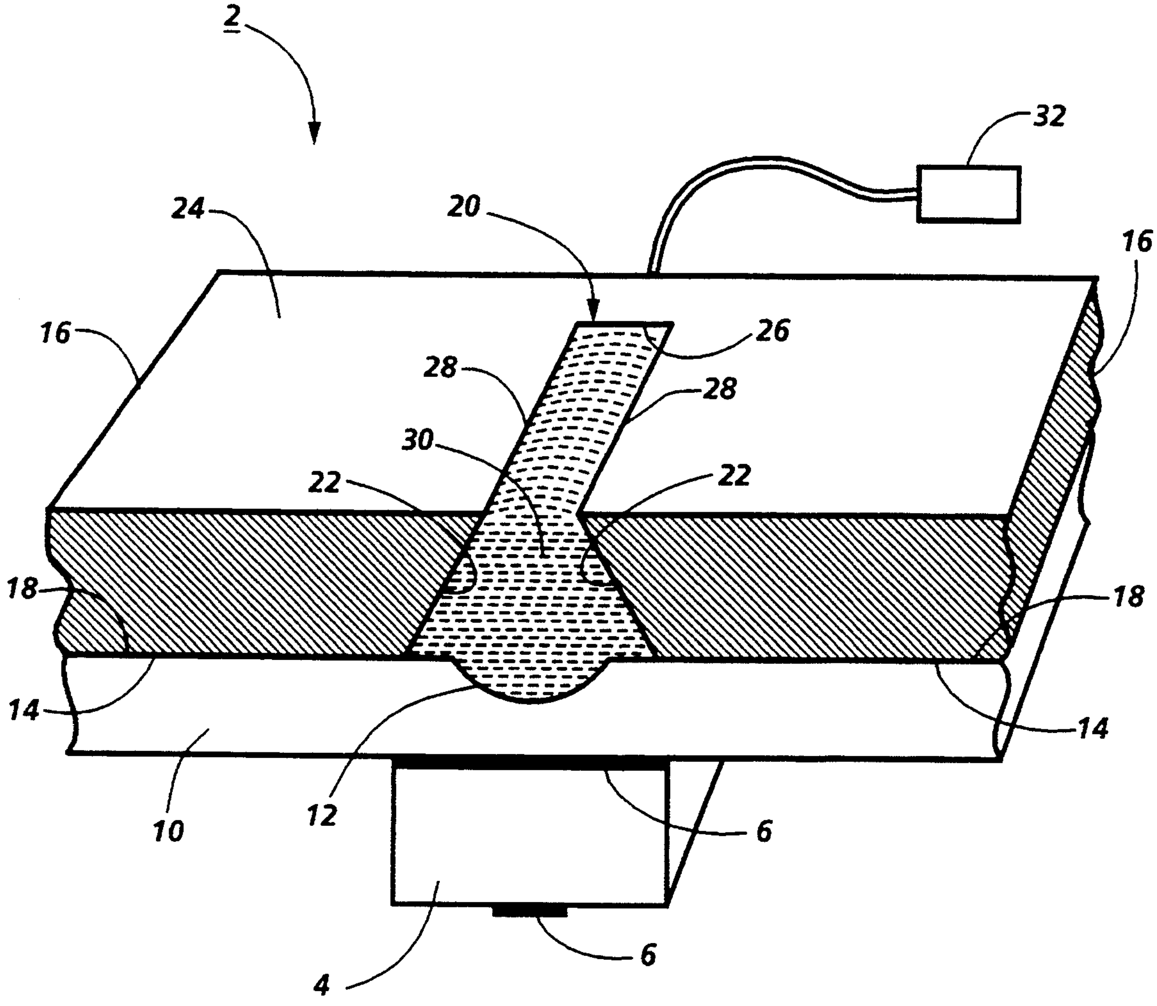
FIG. 1 illustrates an unscaled sectional view of an acoustical droplet ejector according to the principles of the present invention.

Note that in the drawings that like numbers designate like elements. Additionally, for explanatory convenience the text uses directional signals such as up and down, top and bottom, and lower and upper. These signals are derived from the relative positions of the elements as illustrated in the drawings and are meant to aid the reader in understanding the present invention, not to limit it.

DETAILED DESCRIPTION OF THE ILLUSTRATED EMBODIMENT

Refer now to FIG. 1 where an acoustic droplet ejector 2 according to the principles of the present invention is illustrated. To eject a droplet, electrical energy is applied to a transducer 4 (only one of an array of transducers disposed along the axis of a subsequently described elongated channel is shown) via electrodes 6. In response, the transducer 4 generates acoustic energy that passes through a body 10 until it illuminates an associated acoustic lens 12 (only one of an array of substantially identical acoustic lenses disposed in a line along the axis of the subsequently described elongated channel is shown). The lens is fabricated on a flat top surface 14 of the body 10 and is located and dimensioned so as to receive acoustic energy predominately from only one transducer. Each acoustic lens 12 focuses its illuminating acoustic energy into a small area in an acoustic focal plane that is a predetermined distance above the top surface 14.

Still referring to FIG. 1, the acoustic droplet ejector 2 further includes a liquid level control structure 16 that has its bottom surface 18 bonded to the top surface 14. While many bonding techniques could be used, those having precisely controlled bond thicknesses, such as anodic or thin-epoxy bonding, are clearly preferred. The liquid level control structure includes the previously referred to elongated channel 20 that has an axis aligned with the acoustic lens array and the transducer array. The channel 20 is defined by 1) inwardly sloping walls 22 that extends through the liquid level control structure from the bottom surface 18 to a top surface 24, and 2) by front and rear walls 26 (only the rear wall shown in the cut-away view of FIG. 1). The sloping walls 22 and the top surface 24 form protrusions 28, while the front and rear walls 26 are defined by sections of the liquid level control structure that keep the protrusions in a fixed spatial relationship.

Still referring to FIG. 1, the channel 20 forms an open fluid container for holding a marking fluid 30 that is pressurized by a pressure means 32 such that the marking fluid is replenished as droplets are ejected. The marking fluid 30 has an unbounded fluid surface (a free surface opened to the external environment) whose location is controlled by the protrusions 28 and, to some extent, the pressure means. The protrusions provide reference frameworks that interact with the surface tension of the marking fluid 30 so as to fix the location of the unbounded fluid surface. Thus, by accurately positioning the protrusions the location of the unbounded fluid surface can be controlled relative to the acoustic focal plane. The position of the protrusions relative to the acoustic focal plane is controlled by the thickness of the liquid level control structure and the thickness of the bonding material. By controlling these dimensions the unbounded fluid surface is caused to be located near the acoustic focal plane. Since it is the interaction of the protrusions with the surface tension of the marking fluid that controls the location of the unbounded fluid surface, the spacing between the protrusions must be small enough that the surface tension effectively controls the location, but not so small that the protrusions interfere with droplet ejection. A spacing of about 100 micrometers is operational with a droplet having a 10 micrometer diameter. While other techniques conceivably could be used, the liquid level control structure 16 is beneficially produced using semiconductor fabrication technology. This is important given the large number (about 10,000 per printhead) of transducers contemplated to be used.

Figure 2:
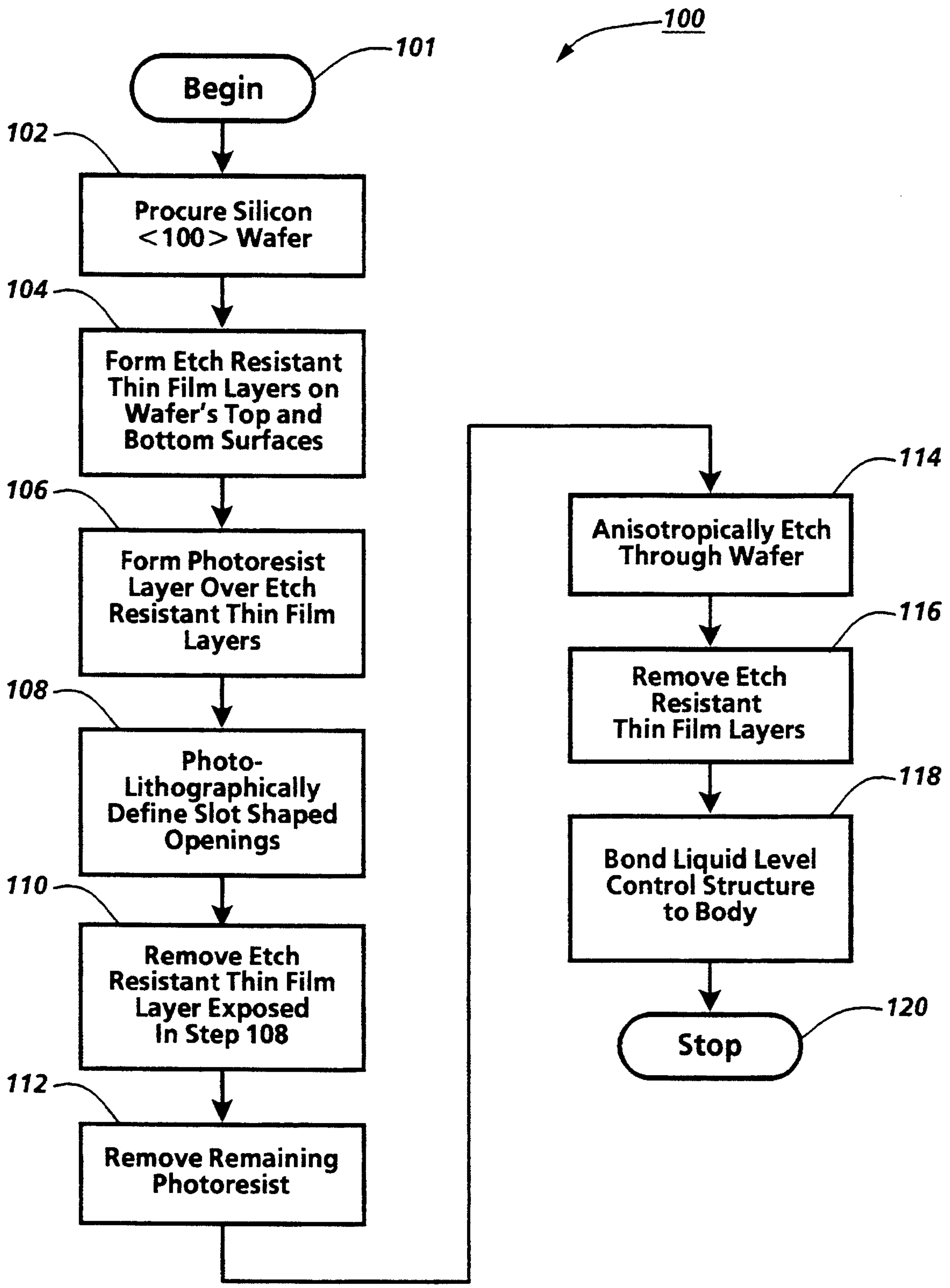
FIG. 2 presents a flow chart of the steps of producing the liquid level control structure of FIG. 1.
Figure 3:
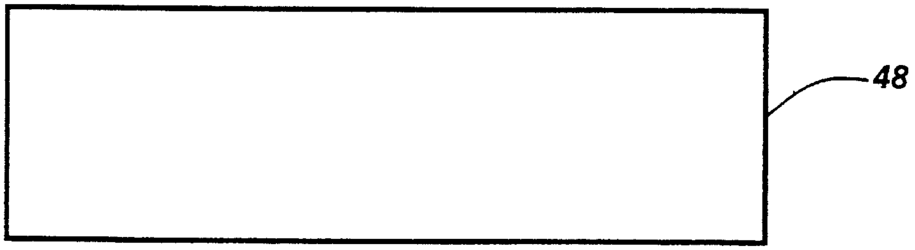
FIG. 3. is an elevational view of a small section of a silicon <100> wafer that will be processed according to the flow chart of FIG. 2.
Figure 4:
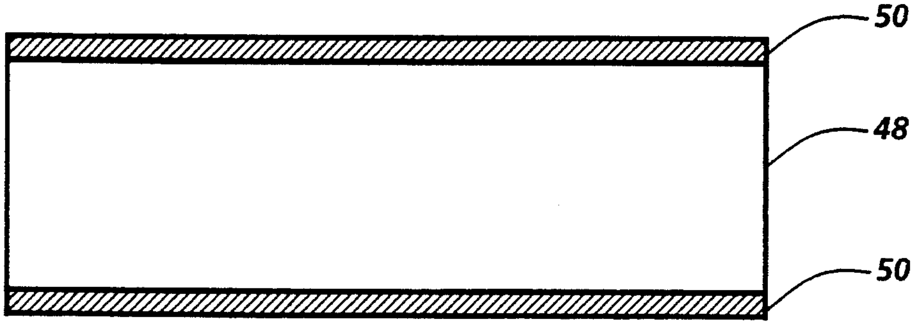
FIG. 4. shows the wafer of FIG. 3 with etch stop layers deposited on its top and bottom surfaces.

A suitable method 100 for manufacturing the liquid level control structure 16 is illustrated in FIG. 2, with the assistance of FIGS. 3 through 11. The method begins, step 101, and proceeds with the procurement of a silicon <100> wafer 48, step 102 and FIG. 3. Etch resistant thin film layers 50, protective coatings that inhibit subsequent etching, are then formed over the top and bottom surfaces of the wafer, step 104 and FIG. 4. Beneficially, the etch resistant layers are silicon nitride, but other thin film layers, such as heavily boron doped silicon, may also be used.

Figure 5:
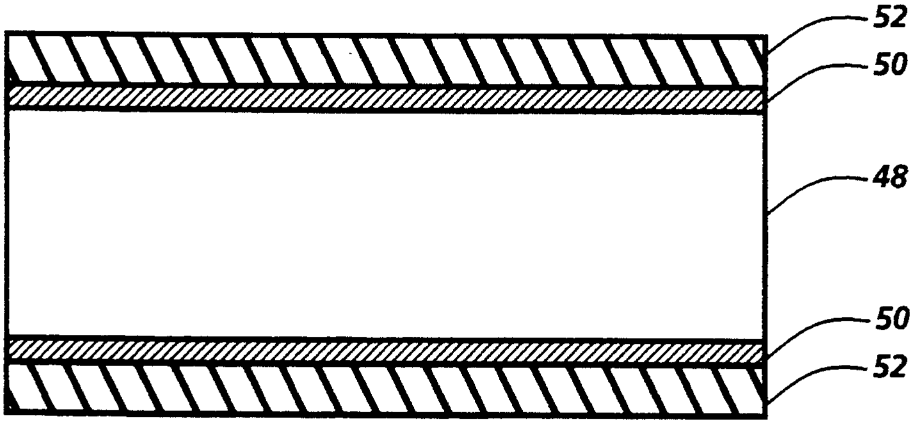
FIG. 5. shows the wafer of FIG. 4 with a photoresist layer deposited over the etch stop layers.
Figure 6:
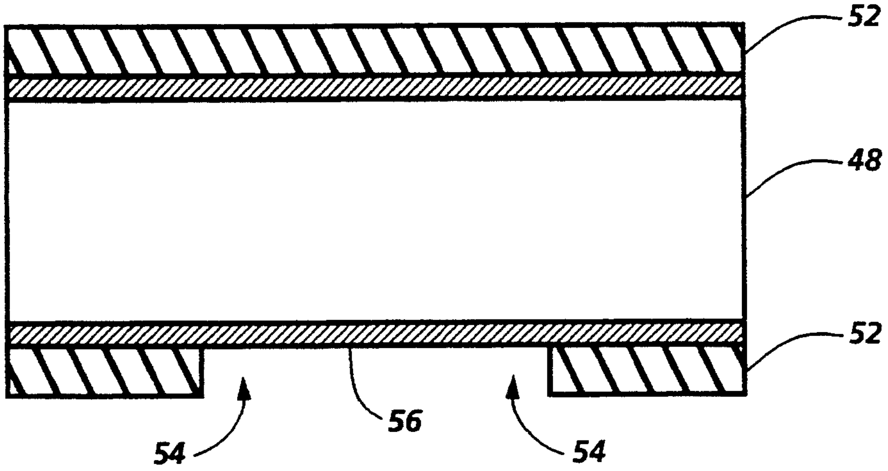
FIG. 6. shows the wafer of FIG. 5 with a slot formed through the bottom photoresist layer.
Figure 7:
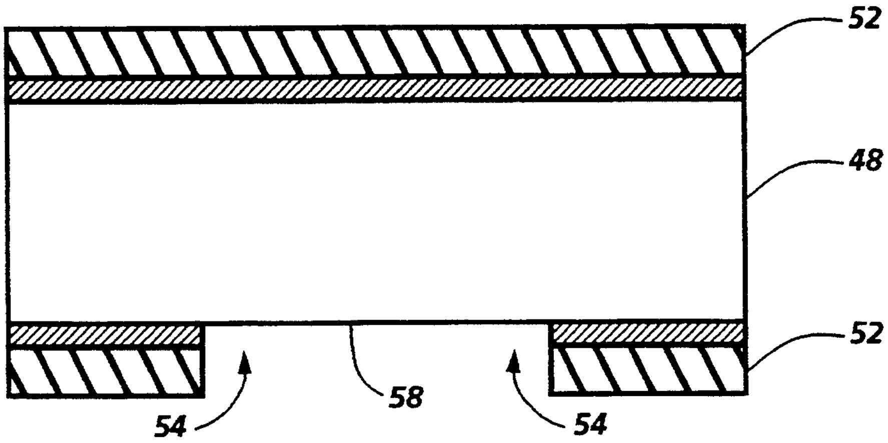
FIG. 7. shows the wafer of FIG. 6 after the exposed etch stop layer is removed to expose a section of the wafer.
Figure 8:
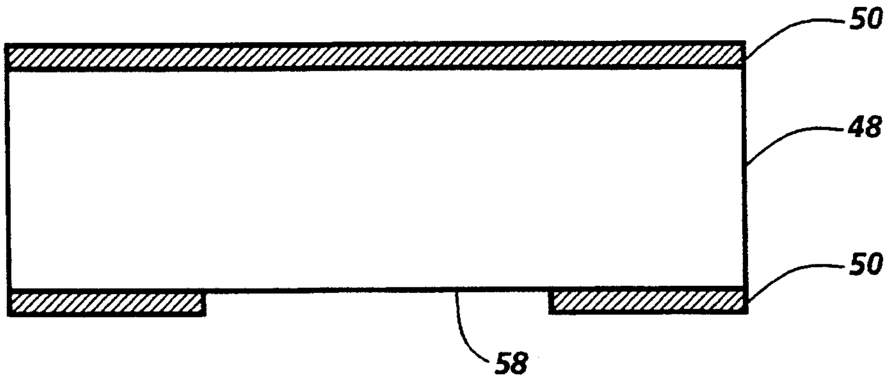
FIG. 8. shows the wafer per FIG. 7 after removal of the photoresist layers.

After step 104, photoresist layers 52 are deposited over the thin film layers 50, step 106 and FIG. 5. Next, an accurately dimensioned, elongated slot 54 is formed through the bottom photoresist layer 52 at the desired channel location using standard photolithographic techniques, step 108 and FIG. 6 (the slot being shown in cross-section) in FIG. 6 et seq.,). The slot 54 defines the lower channel opening and exposes an area 56 of the etch resistant thin film layer 50 to chemical action. The exposed thin film layer area is then removed using a suitable etchant to expose a section 58 of the wafer 48, step 110 and FIG. 7. The remaining photoresist is then removed, step 112 and FIG. 8 to prevent contamination of the subsequent processing steps.

Figure 9:
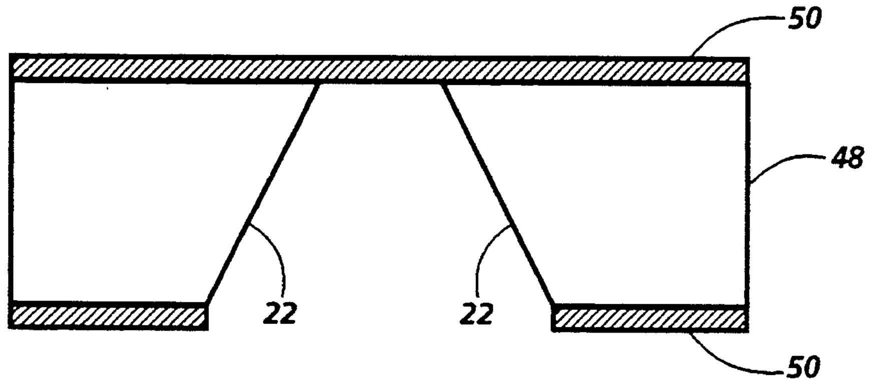
FIG. 9. shows the wafer per FIG. 8 after anisotropic etching through the wafer.
Figure 10:
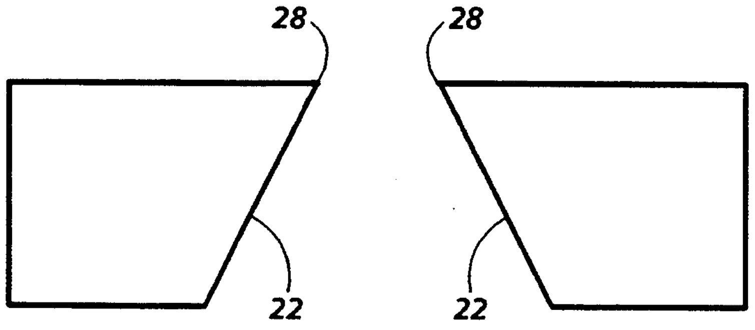
FIG. 10. shows the wafer of FIG. 9 after preparation for bonding.

With the section 58 exposed, the wafer 48 is then anisotropically etched (using a suitable etchant such as potassium hydroxide) from the exposed section through the wafer, step 114 and FIG. 9. The anisotropic etching proceeds along crystalline planes at inwardly sloping angles so that the resulting channel is wider at its bottom then at its top, thus forming the protrusions 28 (shown in FIG. 10) and side walls 22. The etch resistant thin film layer 50 is then removed from the wafer 48, step 116 and FIG. 10, and the liquid level control structure is bonded to the body 10 using a bonding technique such as anodic or epoxy bonding which have a controlled thickness, step 118. The process then stops, step 120, resulting in the acoustic droplet ejector 2 shown in FIG. 1.

Figure 11:
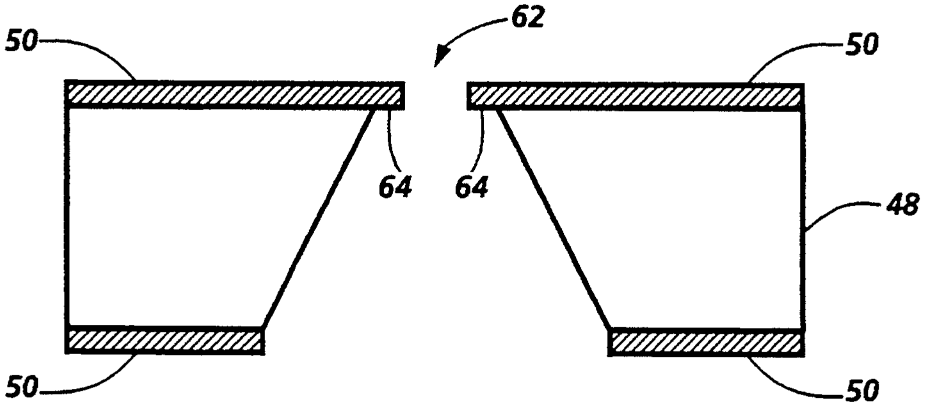
FIG. 11 shows the wafer of FIG. 9 after an alternative preparation for bonding.

An alternative embodiment liquid level control structure 60 is shown in FIG. 11. The embodiment is used in the same manner as the liquid level control structure 16 shown in FIG. 1. The process of making that embodiment follows steps 101 through 114 of FIG. 2 (corresponding to FIGS. 3 through 9, inclusive). However, instead of removing the etch resistant thin film layers per step 116 and FIG. 10, an opening 62 is formed through the top etch resistant thin film layer 50 by use of a suitable method, such as reactive ion etching (RIE). The resulting lips 64 form the framework for interacting with the fluid's surface tension. Thus, the space between the lips (instead of the protrusions) must be controlled to positively interact with the surface tensions of the marking fluid without interfering with droplet ejection. Provided the etch resistant thin film layer 50 is indeed thin and/or is dimensionally stable, the bottom etch resistant thin film layer may be left in place. Otherwise, it should be carefully removed so that the lips 64 remain intact.

From the foregoing, numerous modifications and variations of the principles of the present invention will be obvious to those skilled in its art. Therefore the scope of the present invention is to be defined by the appended claims.

What is claimed:

1. A method of fabricating a liquid level control structure comprising the steps of:
   - procuring a wafer having crystalline planes and opposed top and bottom surfaces;
   - depositing resist layers on said top and bottom surfaces;
   - exposing a section of said bottom surface to chemical action;
   - anisotropically etching said wafer from said bottom surface to said top surface to form a channel having inwardly sloping side walls and
   - removing the resist from said top surface.

2. The method of claim 1, wherein said step of exposing a section of said bottom surface includes the steps of:
   - photolithographically defining a slot shaped section of said resist layer on said bottom surface;

removing said slot shaped section of said resist layer to expose a section of said bottom surface.

3. A method of fabricating a liquid level controller comprising the steps of:

procuring a wafer having crystalline planes and opposed top and bottom surfaces;

depositing a resist layer over said top surface;

anisotropically etching a channel having inwardly sloping side wall through said wafer from said bottom surface to said top surface; and removing said resist layer from over said channel to form lips that extend from said top surface over said channel.

* * * * *